US006791024B2

(12) United States Patent
Toyomura

(10) Patent No.: US 6,791,024 B2
(45) Date of Patent: Sep. 14, 2004

(54) POWER CONVERTER, AND PHOTOVOLTAIC ELEMENT MODULE AND POWER GENERATOR USING THE SAME

(75) Inventor: Fumitaka Toyomura, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/155,137

(22) Filed: May 28, 2002

(65) Prior Publication Data

US 2002/0179140 A1 Dec. 5, 2002

(30) Foreign Application Priority Data

May 30, 2001 (JP) ........................................ 2001-163136
Apr. 24, 2002 (JP) ........................................ 2002-122603

(51) Int. Cl.[7] ....................... H01L 31/048; H01L 31/042
(52) U.S. Cl. ....................... 136/251; 136/244; 136/291; 136/293; 136/258; 136/252; 136/261; 323/906; 363/60; 363/178
(58) Field of Search .................... 136/251, 244, 136/291, 293, 258, 252, 261; 323/906; 363/60, 178

(56) References Cited

U.S. PATENT DOCUMENTS

| 4,217,633 | A | * | 8/1980 | Evans, Jr. ..................... 363/27 |
| 4,461,922 | A | | 7/1984 | Gay et al. .................... 136/249 |
| 5,280,133 | A | | 1/1994 | Nath .......................... 174/52.1 |
| 5,951,785 | A | * | 9/1999 | Uchihashi et al. ........... 136/251 |
| 6,066,797 | A | * | 5/2000 | Toyomura et al. ........... 136/251 |
| 6,593,521 | B2 | * | 7/2003 | Kobayashi ................... 136/244 |
| 6,657,118 | B2 | * | 12/2003 | Toyomura et al. .......... 136/244 |
| 2002/0038666 | A1 | * | 4/2002 | Toyomura et al. .......... 136/256 |
| 2002/0050290 | A1 | * | 5/2002 | Kobayashi ................... 136/293 |
| 2002/0186020 | A1 | * | 12/2002 | Kondo et al. ................ 324/538 |
| 2003/0111103 | A1 | * | 6/2003 | Bower et al. ................ 136/244 |

FOREIGN PATENT DOCUMENTS

| DE | 195 08 250 A1 | 9/1996 |
| DE | 196 09 189 A1 | 9/1997 |
| DE | 298 11 199 U1 | 9/1998 |
| EP | 0 645 804 A2 | 3/1995 |
| EP | 0 793 278 A2 | 9/1997 |
| JP | 7-226465 | 8/1995 |
| JP | 9-069647 | 3/1997 |
| JP | 9-271179 | 10/1997 |
| JP | 11-251614 | 9/1999 |
| JP | 2002-330556 A | * 11/2002 |

OTHER PUBLICATIONS

"Solar Power Generation System Application Technology Development," 1996 Consigned Operation Result Report of New Energy and Industrial Technology Development Organization (NEDO), the Japan Electrical Manufacturers' Association, Mar. 1997, pp. 104–105.

"Solar Power Generation System Application Technology Development," 1997 Consigned Operation Result Report of New Energy and Industrial Technology Development Organization (NEDO), Central Research Institute of Electric Power Industry, Mar. 1998, pp. 148–149.

* cited by examiner

Primary Examiner—Alan Diamond
(74) Attorney, Agent, or Firm—Fitzpatrick, Cella, Harper & Scinto

(57) ABSTRACT

To improve the conversion efficiency of a power converter in a solar cell module in which a solar cell module main body containing a solar cell is integrated with a power converter for converting the output power from the solar cell module main body, a material having small thermal conductivity is used as a member (205) of a protective case for protecting the power converter to be fixed to the solar cell module main body containing the solar cell, thereby preventing easy conduction of heat from the solar cell module main body heated to high temperatures to a power conversion circuit (201). A material having large thermal conductivity is used as a member (206) of a protective case for fixing the power conversion circuit (201), thereby allowing easy radiation of heat generated in the power conversion circuit (201).

24 Claims, 9 Drawing Sheets

POWER CONVERTER, AND PHOTOVOLTAIC ELEMENT MODULE AND POWER GENERATOR USING THE SAME

FIELD OF THE INVENTION

The present invention relates to a solar cell module having a solar cell and a power converter, and a power generator using this solar cell module.

BACKGROUND OF THE INVENTION

Recently, a large number of solar power generating systems are installed to solve environmental problems and the like. In these systems, electric power generated by a solar cell (to be also referred to as a "photovoltaic element" hereinafter) is converted by a power converter, and this power is supplied to a load in a house and/or a commercial power system (to be referred to as a "system" hereinafter).

In addition, a solar cell module (photovoltaic element module) has attracted attention as a small- or medium-scale solar power generating system or as an emergency power supply. In this solar cell module, a small power converter (to be referred to as a "power converter" hereinafter), called an Module Integrated Converter (MIC), for converting electric power generated by a solar cell (photovoltaic element) is attached to the surface (to be referred to as a "rear surface" hereinafter) opposite to the solar cell light-receiving surface (to be referred to as a "light-receiving surface" hereinafter).

Unfortunately, this solar cell module has the following problem. That is, the temperature of the light-receiving surface of the solar cell module rises, and the heat is conducted to the rear surface of the solar cell module. This heat conduction raises not only the temperature of the rear surface on which the power converter is usually mounted, but also the temperature of a power conversion-circuit installed in this power converter.

That is, when the heat conduction from the light-receiving surface of the solar cell module raises the temperature of the power converter, the performance lowers and the power conversion efficiency worsens. In some cases, the power converter may be damaged.

As described above, if insulation of the heat conducted from the solar cell module (photovoltaic element module) to the power converter and radiation of the heat from the power converter are insufficient, the power conversion efficiency worsens, and the power converter may be damaged, or the life of the power converter may shorten even if no immediate damage occurs. To solve this heat problem, Japanese Patent Laid-Open No. 9-271179 discloses an arrangement in which a power converter is mounted in a gap formed in the rear surface of a solar cell module.

When, however, this solar cell module is to be integrated with a building material such as a roofing material, this rear-surface space is very narrow, so the power converter must also be very small. Accordingly, when the power converter is mounted in a gap as in the above disclosure, a large space is necessary, and this interferes with downsizing of the solar cell module. Also, the strength of a structure having a gap as in the above disclosure is low from a viewpoint of mechanics.

SUMMARY OF THE INVENTION

The present invention has been made to solve the problems of the prior art described above, and has as its object to provide a solar cell module (photovoltaic element module) in which a solar cell module (photovoltaic element module) main body containing a solar cell (photovoltaic element) is integrated with a power converter for converting output electric power from the solar cell, and which is suited to downsizing and capable of improving the efficiency and reliability of the power converter.

To achieve the above object, a solar cell module of an embodiment according to the present invention has the following arrangement. That is, a power converter comprises a power conversion circuit for converting an output from a photovoltaic element and outputting the converted output, and a protective case containing the power conversion circuit, characterized in that the protective case comprises a first portion for fixing the protective case to a predetermined portion of a photovoltaic element module having the photovoltaic element, and a second portion for fixing the power conversion circuit, and the first and second portions are made of materials different in thermal conductivity.

For example, the power converter is characterized in that the thermal conductivity of the material of the first portion is smaller than that of the material of the second portion.

For example, the power converter is characterized in that the material of the first portion is a plastic material containing one member selected from the group consisting of polycarbonate, polyamide, polyacetal, modified PPO (PPE), polyester, polyallylate, unsaturated polyester, a phenolic resin, an epoxy resin, polybutyleneterephthalate, nylon, polypropylene, polyvinyl chloride, and an ABS resin.

For example, the power converter is characterized in that the material of the second portion contains one member selected from the group consisting of an aluminum plate, stainless steel plate, zinc-plated steel plate, galvalume steel plate, titanium steel plate, and stainless steel plate.

For example, the power converter is characterized in that the material of the second portion is a resin mixed with a thermally conductive material.

For example, the power converter is characterized in that the thermally conductive material contains at least one of a metal powder, metal oxide, metal fibers, metal-coated glass beads, and synthetic fibers.

For example, the power converter is characterized in that a metal forming the thermally conductive material contains at least one of Al, Cu, Ni, ZnO, $SnO_2$, Ag, and stainless steel.

For example, the power converter is characterized in that the thermally conductive material contains at least one of carbon black, carbon fibers, and graphite.

For example, the power converter is characterized in that the material of the first portion is a plastic material containing one member selected from the group consisting of polycarbonate, polyamide, polyacetal, modified PPO (PPE), polyester, polyallylate, unsaturated polyester, a phenolic resin, an epoxy resin, polybutyleneterephthalate, nylon, polypropyrene, polyvinyl chloride, and an ABS resin.

For example, the power converter is characterized in that the power conversion circuit is fixed in contact with a surface of the second portion.

For example, the power converter is characterized in that the power conversion circuit is fixed away from the second portion.

For example, the power converter is characterized in that the power conversion circuit is fixed to the second portion by using fixing means.

For example, the power converter is characterized in that the fixing means is mechanical fixation using a screw or fixation using an adhesive or filler.

For example, the power converter is characterized in that an adhesive or filler is packed between the protective case and the power conversion circuit.

For example, the power converter is characterized in that the power converter is an inverter which converts DC power into AC power.

For example, the power converter is characterized in that the power conversion circuit is mounted on a substrate having a metal core.

For example, the power converter is characterized in that the power converter is a DC/DC converter which converts DC power into another DC power having a different voltage.

For example, the power converter is characterized in that the photovoltaic element contains one member selected from the group consisting of a silicon semiconductor, compound semiconductor, single-crystal silicon, polysilicon, amorphous silicon, and thin-film polysilicon.

For example, the power converter is characterized in that the photovoltaic element is filled with a transparent insulating member and contained in a main body of the photovoltaic element module.

For example, the power converter is characterized in that the insulating member is rendered transparent by the use of one member selected from the group consisting of an ethylene-vinyl acetate copolymer (EVA), ethylene-methyl acrylate copolymer (EMA), ethylene-ethyl acrylate copolymer (EEA), and polyvinyl butyral resin.

To achieve the above object, a photovoltaic element module of an embodiment according to the present invention has the following arrangement. That is, a photovoltaic element module comprises a power converter comprising a power conversion circuit for converting an output from a photovoltaic element and outputting the converted output, and a protective case containing the power conversion circuit, and a photovoltaic element module main body having the photovoltaic element, characterized in that the protective case comprises a first portion for fixing the protective case to a predetermined portion of the photovoltaic element module having the photovoltaic element, and a second portion for fixing the power conversion circuit, and the first and second portions are made of materials different in thermal conductivity.

To achieve the above object, a power generator of an embodiment according to the present invention has the following arrangement. That is, a power generator uses a photovoltaic element module comprising a power converter comprising a power conversion circuit for converting an output from a photovoltaic element and outputting the converted output, and a protective case containing the power conversion circuit, and a photovoltaic element module main body having the photovoltaic element, characterized in that the protective case comprises a first portion for fixing the protective case to a predetermined portion of the photovoltaic element module having the photovoltaic element, and a second portion for fixing the power conversion circuit, and the first and second portions are made of materials different in thermal conductivity.

For example, the power generator is characterized in that the power generator comprises a plurality of photovoltaic element module main bodies, and the plurality of photovoltaic element module main bodies are connected to the power converter.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

An embodiment according to the present invention will be explained below with reference to the accompanying drawings.

Although the explanation will be made by using a solar cell module according to the present invention, the scope of the invention is no limited to the described examples.

[First Embodiment]

An outline of a solar cell module 101 will be described first, and then each constituent element will be explained. Finally, a method of manufacturing a solar cell module main body 110 and a power converter 107 and a method of mounting the power converter 107 onto the solar cell module main body 110 will be explained.

Figure 1:
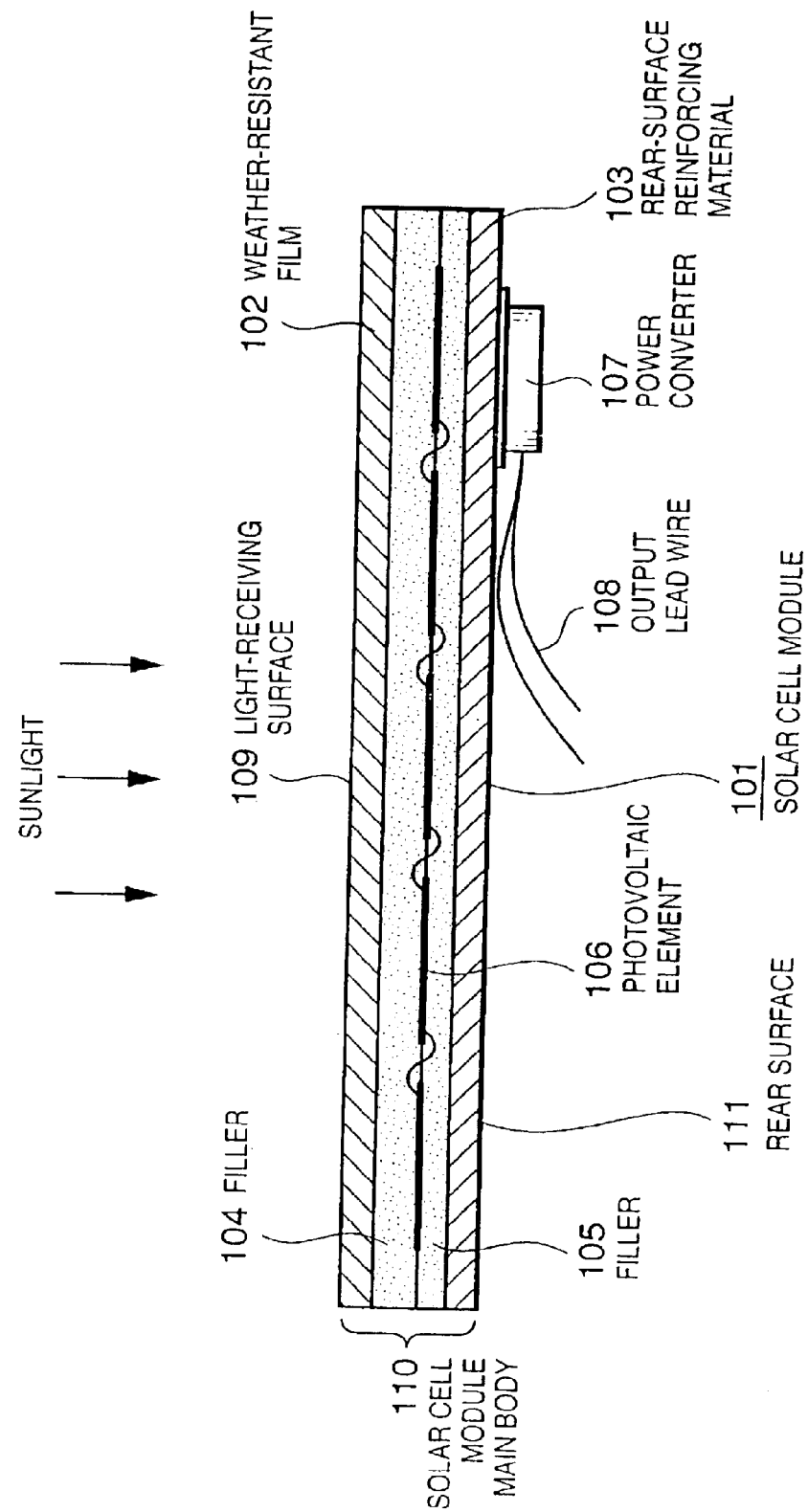
FIG. 1 is a sectional view showing the arrangement of a solar cell module of the first embodiment according to the present invention.

FIG. 1 is a schematic sectional view showing the arrangement of the solar cell module 101 of the first embodiment according to the present invention.

That is, FIG. 1 shows an example of the solar cell module 101 obtained by integrating the solar cell module main body 110 containing a photovoltaic element (solar cell) 106 and the power converter 107.

The solar cell module main body 110 is made up of a weather-resistant film 102, a filler 104, the photovoltaic element 106, a filler 105, and a rear-surface reinforcing material 103. Output lead wires 108 for extracting output are connected to the power converter 107.

The weather-resistant film 102 is formed on a light-receiving surface 109 of the solar cell module main body 110. The photovoltaic element 106 is placed inside the light-receiving surface 109. The light-transmitting fillers 104 and 105 are formed around the photovoltaic element 106 to fix this photovoltaic element 106.

The rear-surface reinforcing material 103 for reinforcement is formed on a rear surface 111 opposite to the light-receiving surface 109 of the solar cell module 101. On this rear-surface reinforcing material 103, the power converter 107 for converting electric power generated by the photovoltaic element 106 is placed.

A weather-resistant transparent film is used as the weather-resistant film 102 as a protective material of the light-receiving surface 109. A metal steel plate such as used as a metal roof is used as the rear-surface reinforcing material 103. The surface of this metal steel plate can also be coated with a polyester resin or fluorine resin in order to increase, e.g., the weather resistance.

The characteristic feature of the solar cell module 101 having the above structure is that this solar cell module 101 can be easily formed, by bending or the like, into the shape of a roofing material such as a folded plate shape, roll shape, or stepping roof shape, or into the shape of a building material such as a wall material.

In particular, an amorphous silicon solar cell using a conductive substrate to be described later has high mechanical strength and flexibility. Therefore, the solar cell module 101 using this amorphous silicon solar cell has a high degree of freedom of shape and hence can be formed into various roof shapes and wall shapes.

[Photovoltaic Element]

The photovoltaic element 106 is not particularly limited, and it is possible to use, e.g., a single-crystal silicon solar cell, polysilicon solar cell, and amorphous silicon solar cell each consisting of a silicon semiconductor.

Compound semiconductors can also be used. Examples are a group III-V compound solar cell, group II-VI compound solar cell, and group I-III-VI compound solar cell.

In particular, an amorphous silicon solar cell restores its power generation efficiency by an annealing effect at a high temperature, and can be formed on a film or on a conductive-material substrate by using the thin film technologies. This can reduce the weight of the photovoltaic element 106 itself. Accordingly, when the solar cell module 101 integrated with a building material is to be formed, it is particularly preferable to use an amorphous silicon solar cell as the photovoltaic element 106.

[Power Converter]

As the power converter 107, it is possible to use an inverter which converts DC power into AC power, or a DC/DC converter which converts DC power into another DC power having a different voltage (i.e., which raises or lowers the voltage).

In the following description, a case in which this power converter 107 is an inverter will be explained as an example with reference to FIG. 2.

Figure 2:
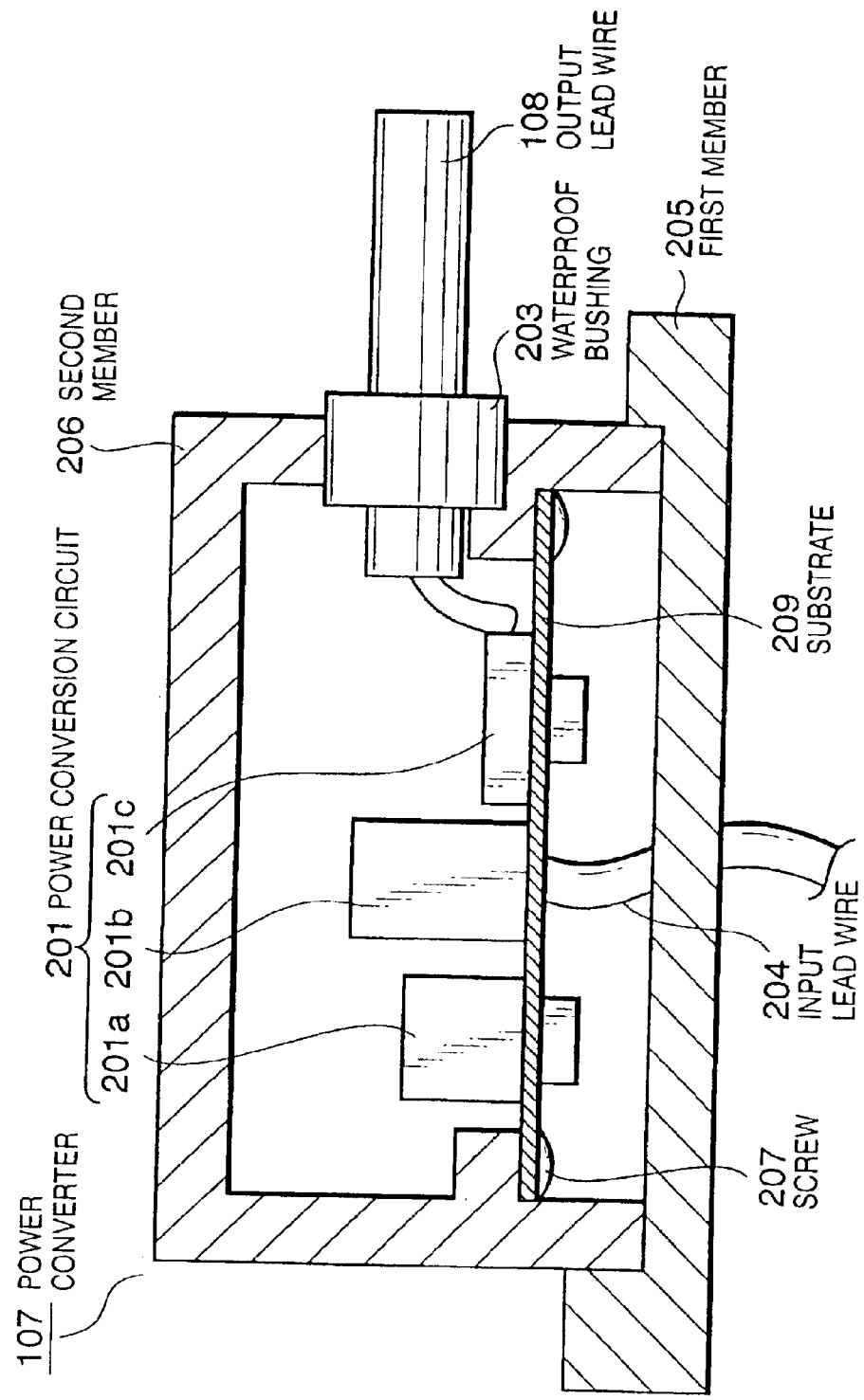
FIG. 2 is a sectional view showing the arrangement of a power converter of the first embodiment according to the present invention.

FIG. 2 is a sectional view of the power converter 107.

This power converter 107 comprises input lead wires 204 connected to the photovoltaic element 106, a power conversion circuit 201 for power conversion, and the output lead wires 108 for power output. The power converter 107 further includes a waterproof bushing 203 and first and second members 205 and 206 as sheathing materials for protecting the above components.

The waterproof bushing 203 prevents the invasion of rainwater from the output lead wires 108 into the power converter 107. The first member 205 is a portion to be attached to the rear-surface reinforcing material 103 of the solar cell module main body 110. This first member 205 is made of a resin having a high heat resistance, since the first member 205 is brought into contact with the rear-surface reinforcing material 103 which is heated to high temperatures. The second member 206 is made of a metal superior in heat radiation properties.

The power conversion circuit 201 includes a booster circuit 201a, an inverter circuit 201b, a control circuit 201c, a system interconnection protection circuit (not shown), and a communication circuit (not shown). The booster circuit 201a boosts an output DC voltage from the photovoltaic element 106 into an input voltage to the inverter circuit. The inverter circuit 201b converts DC power into AC power. The control circuit 201c controls activation/stop of power conversion, optimization of the operating point of the photovoltaic element 206, and the operation mode.

As the booster circuit 201a, a step-up chopper circuit, various kind of publicly known circuits can be used. As the inverter circuit 201b, a voltage-fed inverter using an IGBT or MOSFET as a switching element is preferred. By driving the gate of this switching element by a control signal from the control circuit 201c, AC power having a desired frequency, phase, and voltage can be obtained.

The control circuit 201c includes, e.g., a CPU, PWM waveform control circuit, frequency voltage reference generator, current reference generator, mode switch, and switching control circuit. This control circuit 201c can also be externally operated via communication lines or the like. Furthermore, a plurality of power converters 107 can be simultaneously controlled by placing the control circuit 201c outside these power converters 107.

The first member 205 as a sheathing material of the power converter 107 is brought into contact with the rear-surface reinforcing material 103 of the solar cell module main body 110. In order that heat of the rear-surface reinforcing material 103 heated to a high temperature be not readily conducted to the power conversion circuit 201 inside the power converter 107 or to the second member 206, this first member 205 must be made of a material having small thermal conductivity. It is particularly favorable to use heat-resistant plastic materials such as polycarbonate, polyamide, polyacetal, modified PPO (PPE), polyester, polyallylate, unsaturated polyester, phenolic resin, epoxy resin, polybutyleneterephthalate, nylon, polypropyrene, polyvinyl chloride, and ABS (Acrylonitrile.Butadiene.Styrene) resin.

To efficiently radiate heat from the booster circuit 201a, the switching element of the inverter circuit 201b, and a utility-interactive reactor, the second member 206 is preferably made of a high-thermal-conductivity material having high mechanical strength and excellent heat radiation properties. For example, a metal which facilitates mounting of the power converter 107 is favored. Aluminum, copper, and their alloys are particularly favored.

The power conversion circuit 201 is mounted on a printed circuit board or some other substrate 209 superior in heat radiation properties. This substrate 209 is fastened to the second member 206 by using screws 207.

Heat generated by the power conversion circuit 201, therefore, is conducted to the second member 206 via the substrate 209 having superior heat radiation properties, and radiated from this second member 206.

The substrate 209 can also be fastened by using, e.g., an adhesive or filler, instead of the screws 207.

Additionally, a heat-conducting member can be further interposed between the power conversion circuit 201 and the second member 206 to promote the radiation of heat from this second member 206.

[Rear-Surface Reinforcing Material]

The material of the rear-surface reinforcing material 103 of the solar cell module main body 110 is not particularly restricted. However, a material which has high mechanical strength and which is strained or warped little upon temperature changes is preferred. For example, reinforced glass and a metal plate can be used.

Examples of usable materials are metals, carbon fibers, FRP (Fiber Reinforced Plastics), ceramics, polycarbonate, glass, and Tedlar/Al/Tedlar.

For example, it is possible to use an aluminum plate, stainless steel plate, titanium plate, and plated steel plates such as a zinc-plated steel plate and galvalume steel plate. However, the material is not limited to these metal plates.

Also, the durability of any of the above materials can be increased by performing anodic oxidation on the surface or by coating the surface with a resin such as a polyester resin or acrylic resin.

The solar cell module 101 integrated with a metal roofing material is sometimes bent when in use. However, when a metal plate is used as the rear-surface reinforcing material 103, this solar cell module 101 can be handled in the same manner as general metal roofing materials.

[Manufacturing Methods]
[Manufacture of Solar Cell Module]

An example of a method of manufacturing the solar cell module main body 110 will be explained below.

As the materials, ETFE (EthyleneTetraFluoroEthylene) is used as the weather-resistant film 102, a 0.4-mm thick steel plate coated with a polyester resin is used as the rear-surface reinforcing material 103, and EVA (Ethylene-Vinyl Acetate copolymer, weather-resistant grade) is used as the fillers 104 and 105.

As shown in FIG. 1, the rear-surface reinforcing material 103 is set, and the filler 105, the photovoltaic element 106, the filler 104, and the weather-resistant film 102 are laminated in this order on the rear-surface reinforcing material 103, thereby obtaining a laminated body.

A vacuum laminator is then used to melt the fillers 104 and 105 of this laminated body at 150° C. Consequently, it is possible to manufacture the solar cell module main body 110 in which the photovoltaic element 106 is resin-encapsulated between the rear-surface reinforcing material 103 and the weather-resistant film 102.

[Manufacture of Power Converter]

An example of a method of manufacturing the power converter 107 will be described below with reference to FIG. 2.

First, the waterproof bushing 203 is attached to the second member 206.

The power conversion circuit 201 is mounted on the substrate 209 beforehand.

The output portion of this power conversion circuit 201 is electrically connected to the output lead wires 108 by soldering or screwing.

The input lead wires 204 are electrically connected to the input portion of the power conversion circuit 201 by soldering.

After the output lead wires 204 are inserted into the waterproof bushing 203, the power conversion circuit 201 is held in a predetermined position and fastened to the second member 205 by the screws 207.

Finally, the power converter 107 can be completed by attaching the first member 205 to the opening of the second member 206 by an adhesive (not shown).

[Mounting of Power Converter]

Figure 3:
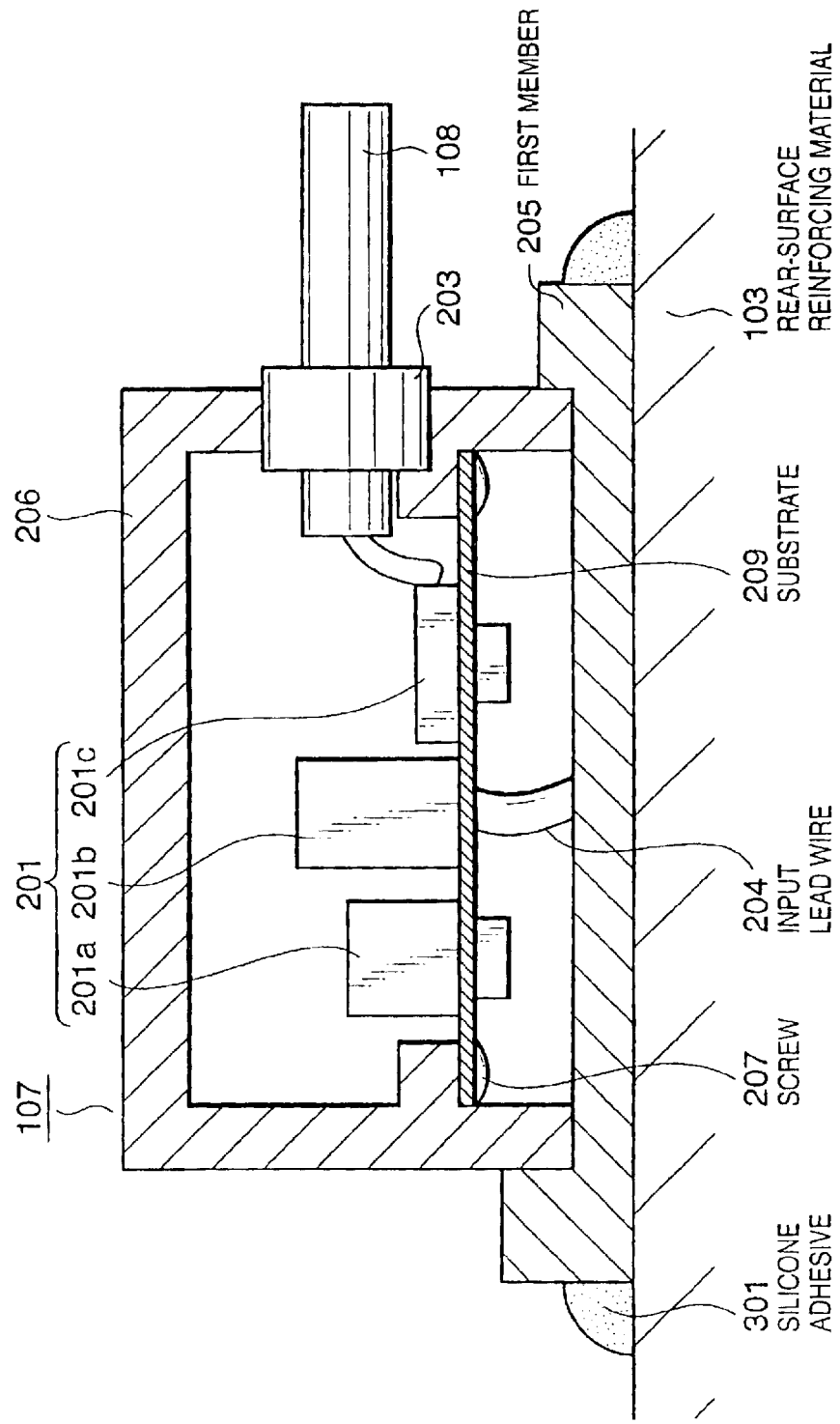
FIG. 3 is a sectional view for explaining a method of mounting the power converter of the first embodiment.

A method of mounting the power converter 107 onto the solar cell module main body 110 will be described below with reference to FIG. 3.

The rear-surface reinforcing material 103 is a rectangular steel plate coated with a polyester resin. A hole about 15 mm in diameter is formed beforehand in that portion of this rear-surface reinforcing material 103, which corresponds to an electrode (not shown) for extracting power from the photovoltaic element 106. However, this hole is filled with the filler 105 when the solar cell module main body 110 is manufactured.

First, therefore, the filler 105 in this terminal portion is removed, and then the input lead wires of the power converter 107 are soldered to the electrode (not shown) of the photovoltaic element 106.

Subsequently, a predetermined amount of a silicone adhesive 301 is applied to the first member 205 of the power converter 107, and the power converter 107 is adhered to the rear-surface reinforcing material 103.

In this manner, the solar cell module 101 in which the power converter 107 is integrated with the solar cell module main body 110 is manufactured.

If the power converter 107 is an inverter explained previously, a plurality of such solar cell modules 101 connected to each other can be used in a house load or/and interconnected to the utility line.

When a predetermined solar radiation amount is given to the solar cell module 101 thus manufactured, the power converter 107 converts DC power generated by the photovoltaic element 106 into AC power, and this AC power can be output through the output lead wires 108.

The first member 205 having small thermal conductivity prevents the conduction of heat from the solar cell module main body 110 heated to a high temperature by solar radiation, to the power converter 107 via the rear-surface reinforcing material 103.

Also, heat generated by the power converter 107 is effectively radiated from the second member 206 having large thermal conductivity via the substrate 209. This can improve the conversion efficiency and reliability of the power converter 107.

[Second Embodiment]

A solar cell module 2101 of the second embodiment according to the present invention will be described below.

A solar cell module main body 110 of this solar cell module 2101 is exactly the same as the solar cell module main body 110 of the solar cell module 101 explained in the first embodiment, and only a power converter 2107 is different.

In the following explanation, therefore, that view showing the whole configuration of the solar cell module 2101, which corresponds to FIG. 1, and a common description thereof will be omitted to avoid duplication, and only differences from the power converter 107 will be explained by using the power converter 2107 shown in FIG. 4.

In this explanation of FIG. 4, the same reference numerals as in the power converter 107 shown in FIG. 2 denote the same parts and a detailed description thereof will be omitted to avoid duplication, and only differences will be explained.

[Power Converter]

First, the characteristic feature of the power converter 2107 of the second embodiment will be described below.

This power converter 2107 is characterized in that the radiation of heat generated from a power conversion circuit 201 inside the power converter 2107 is superior to that of the power converter 107 in the first embodiment.

The arrangement of the power converter 2107 will be explained next.

The components of this power converter 2107 are the same as in the power converter 107 except for the mounting positions; these components are mounted upside down.

That is, in this power converter 2107, the power conversion circuit 201 is mounted on a printed wiring board having superior heat radiation properties. This printed wiring board is set using an adhesive 2402 (or a filler) so as to come in contact with a second member 206.

The adhesive 2402 (or the filler) is interposed between the power conversion circuit 201 and the second member 206 to fix the power conversion circuit 201 to the second member 206. This adhesive 2402 also efficiently conducts heat generated by the power conversion circuit 201 to the second member 206.

The adhesive 2402 (or the filler) is preferably one which improves workability when the power conversion circuit 201 is mounted. For example, an adhesive which has a short curing time and a viscosity of 40 to 1,000 Pa·s, i.e., which is not excessively viscous is preferred. Examples are metals and metal oxides such as silver, aluminum, and aluminum oxide, and resins such as silicone, acryl, epoxy, and urethane each containing thermally conductive additives.

Figure 4:
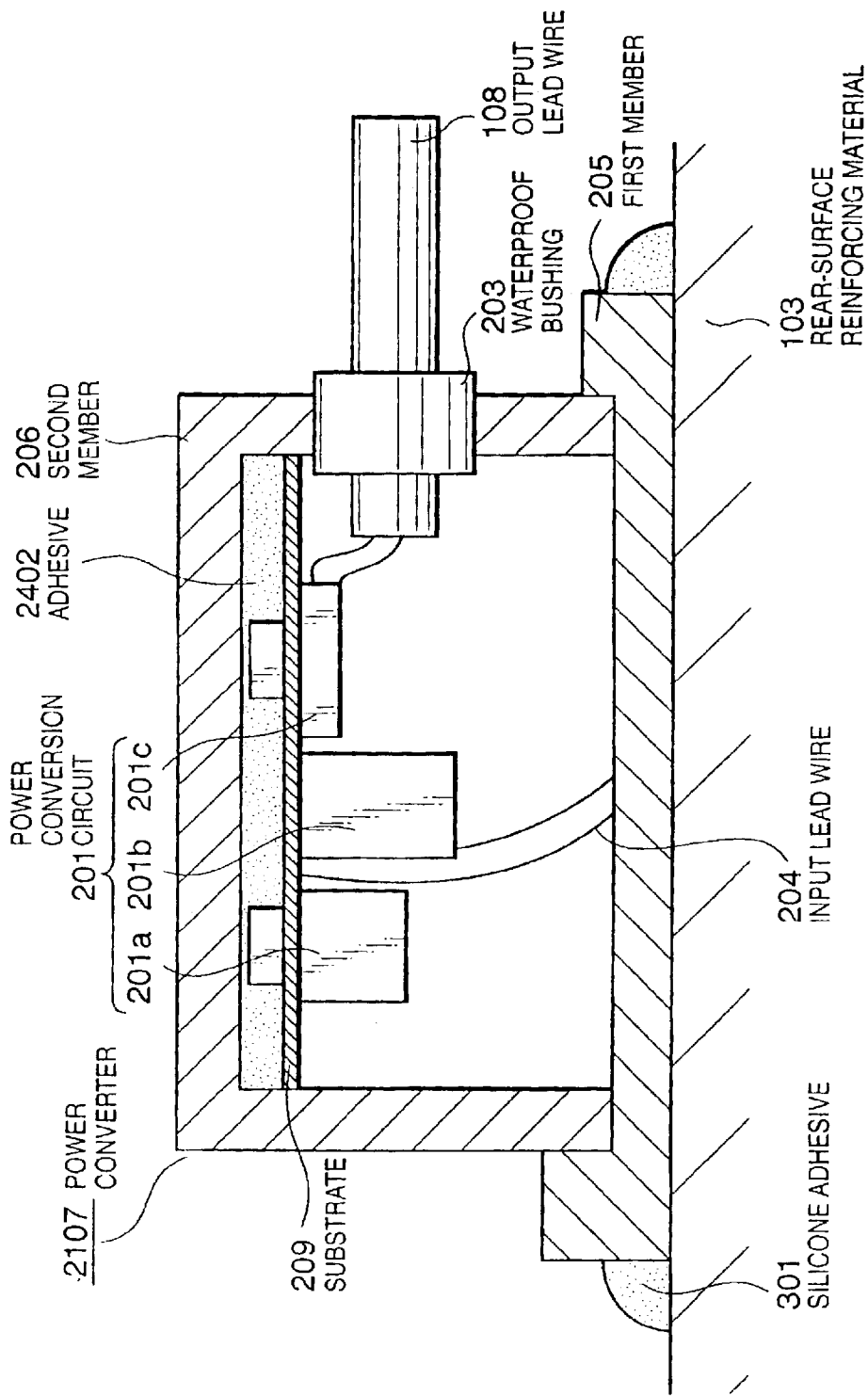
FIG. 4 is a sectional view showing the arrangement of a power converter of the second embodiment according to the present invention.

When a predetermined solar radiation amount is given to the solar cell module 2101 (not shown) in which the power converter 2107 shown in FIG. 4 is integrated with the solar cell module main body 110, the power converter 2107 converts DC power generated by a photovoltaic element 106 into AC power, and this AC power can be output through output lead wires 108.

A first member 205 having small thermal conductivity prevents the conduction of heat from the solar cell module 2101 heated to a high temperature by solar radiation, to the power converter 2107 via a rear-surface reinforcing material 103.

Also, heat generated by the power conversion circuit 201 is effectively radiated from the second member 206 having large thermal conductivity via a substrate 209. This can improve the conversion efficiency and reliability of the power converter 2107.

[Third Embodiment]

A solar cell module 3101 of the third embodiment according to the present invention will be described below.

A solar cell module main body 110 of this solar cell module 3101 is exactly the same as the solar cell module main body 110 of the solar cell module 101 explained in the first embodiment, and only a power converter 3107 is different.

In the following explanation, therefore, that view showing the whole configuration of the solar cell module 3101, which corresponds to FIG. 1, and a common description thereof will be omitted to avoid duplication, and only differences from the power converter 107 will be explained by using the power converter 3107 shown in FIG. 5.

In this explanation of FIG. 5, the same reference numerals as in the power converter 107 shown in FIG. 2 denote the same parts and a detailed description thereof will be omitted to avoid duplication, and only differences will be explained.

[Power Converter]

First, the characteristic feature of the power converter 3107 of the third embodiment will be described below.

This power converter 3107 is characterized in that the radiation of heat generated from a power conversion circuit 201 inside the power converter 3107 is superior to that of the power converter 107 in the first embodiment.

The arrangement of the power converter 3107 will be explained next.

The components of this power converter 3107 are the same as in the power converter 107 except for the mounting positions; these components are mounted upside down.

That is, in this power converter 3107, a printed wiring board superior in heat radiation properties on which the power conversion circuit 201 is mounted is set using an adhesive 3402 (and a filler) so as to come in contact with a second member 206.

The adhesive 3402 (and the filler) is packed in the entire power conversion circuit 201 to fix the power conversion circuit 201 to the second member 206. This adhesive 3402 also efficiently conducts heat generated by the power conversion circuit 201 to the second member 206.

The adhesive 3402 (and the filler) can be any material provided that the material has self-bonding properties, thermal contact bonding properties, and adhesive properties, and can fix the power converter 3107. Also, the adhesive 3402 (and the filler) can take the form of any of a gel, paste, grease, sheet, and oil compound. However, the form is not limited to these forms.

The adhesive 3402 (and the filler) is preferably one which improves workability when the power conversion circuit 201 is mounted. For example, an adhesive which has a short curing time and a viscosity of 40 to 1,000 Pa·s, i.e., which is not excessively viscous is preferred. Examples are metals and metal oxides such as silver, aluminum, and aluminum oxide, and resins such as silicone, acryl, epoxy, and urethane each containing thermally conductive additives.

Figure 5:
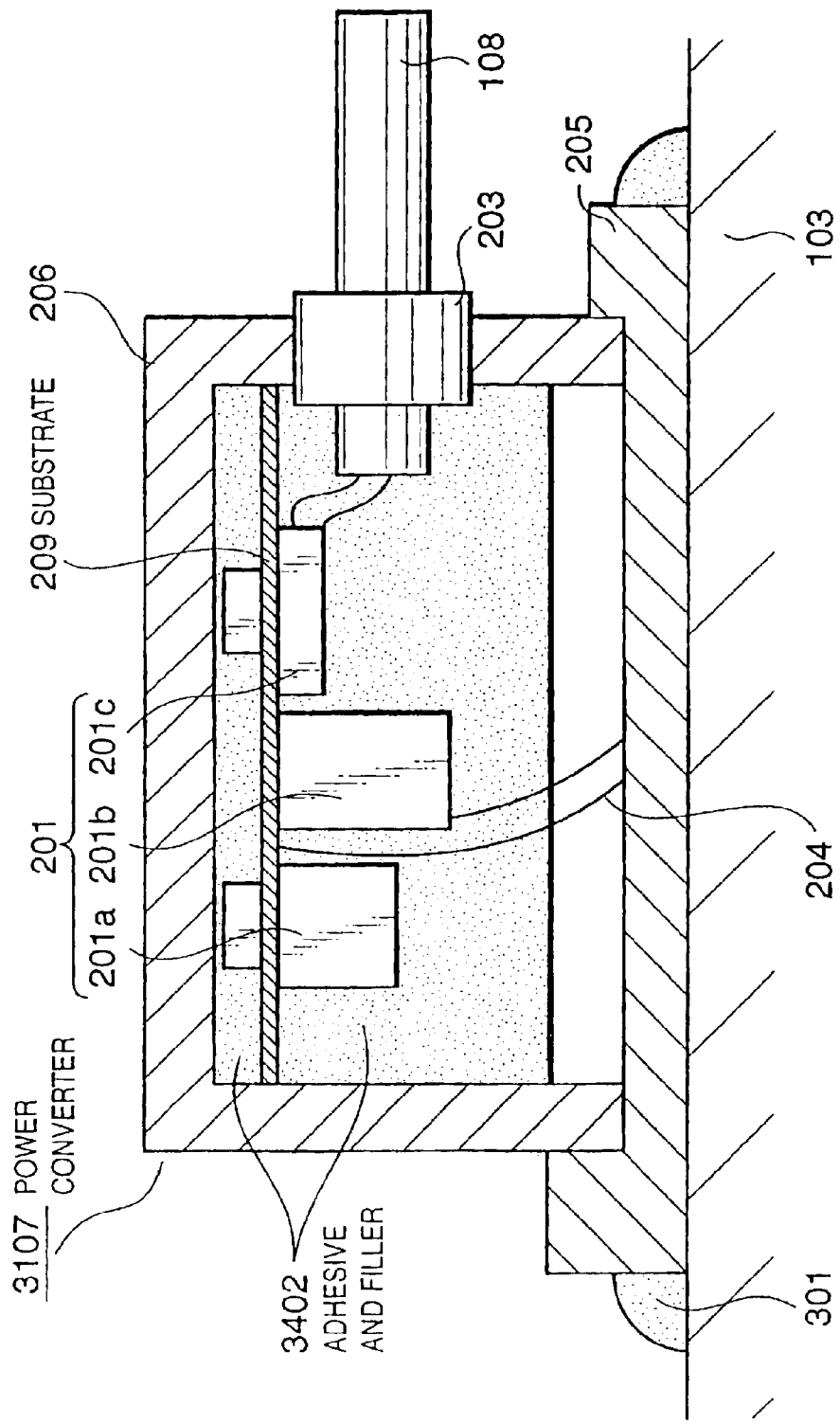
FIG. 5 is a sectional view showing the arrangement of a power converter of the third embodiment according to the present invention.

When a predetermined solar radiation amount is given to the solar cell module 3101 (not shown) in which the power converter 3107 shown in FIG. 5 is integrated with the solar cell module main body 110, the power converter 3107 converts DC power generated by a photovoltaic element 106 into AC power, and this AC power can be output through output lead wires 108.

A first member 205 having small thermal conductivity prevents the conduction of heat from the solar cell module 3101 heated to a high temperature by solar radiation, to the power converter 3107 via a rear-surface reinforcing material 103.

Also, heat generated by the power conversion circuit 201 is effectively radiated from the second member 206 having large thermal conductivity via a substrate 209. This can improve the conversion efficiency and reliability of the power converter 3107.

[Fourth Embodiment]

A solar cell module 4101 of the fourth embodiment according to the present invention will be described below.

A solar cell module main body 110 of this solar cell module 4101 is exactly the same as the solar cell module main body 110 of the solar cell module 101 explained in the first embodiment, and only a power converter 4107 is different.

In the following explanation, therefore, that view showing the whole configuration of the solar cell module 4101, which corresponds to FIG. 1, and a common description thereof will be omitted to avoid duplication, and only differences from the power converter 107 will be explained by using the power converter 4107 shown in FIG. 6.

In this explanation of FIG. 6, the same reference numerals as in the power converter 107 shown in FIG. 2 denote the same parts and a detailed description thereof will be omitted to avoid duplication, and only differences will be explained.

[Power Converter]

First, the characteristic feature of the power converter 4107 of the fourth embodiment will be described below.

This power converter 4107 is characterized in that the radiation of heat generated from a power conversion circuit 201 inside the power converter 4107 is superior to that of the power converter 107 in the first embodiment.

That is, as will be described later, a substrate 209 on which the power conversion circuit 201 is mounted has a metal core 703 in layers of this substrate 209. In addition, this metal core 703 projects to the outside from end portions of a surface insulating layer 704. These projecting portions form a mounting members 4602 to be fixed to a second member 206. Accordingly, the substrate 209 is mounted on the second member 206 by these mounting members 4602, so heat generated by the power conversion circuit 201 can be effectively radiated to the outside via the second member 206.

The arrangement of the power converter 4107 will be explained next.

The components of this power converter 4107 are the same as in the power converter 107 except for the mounting positions; these components are mounted upside down.

That is, in this power converter 4107, the printed wiring board or some other substrate 209 superior in heat radiation properties on which the power conversion circuit 201 is mounted is set using an adhesive or screws (not shown) so as to come in contact with the second member 206.

Figure 7:
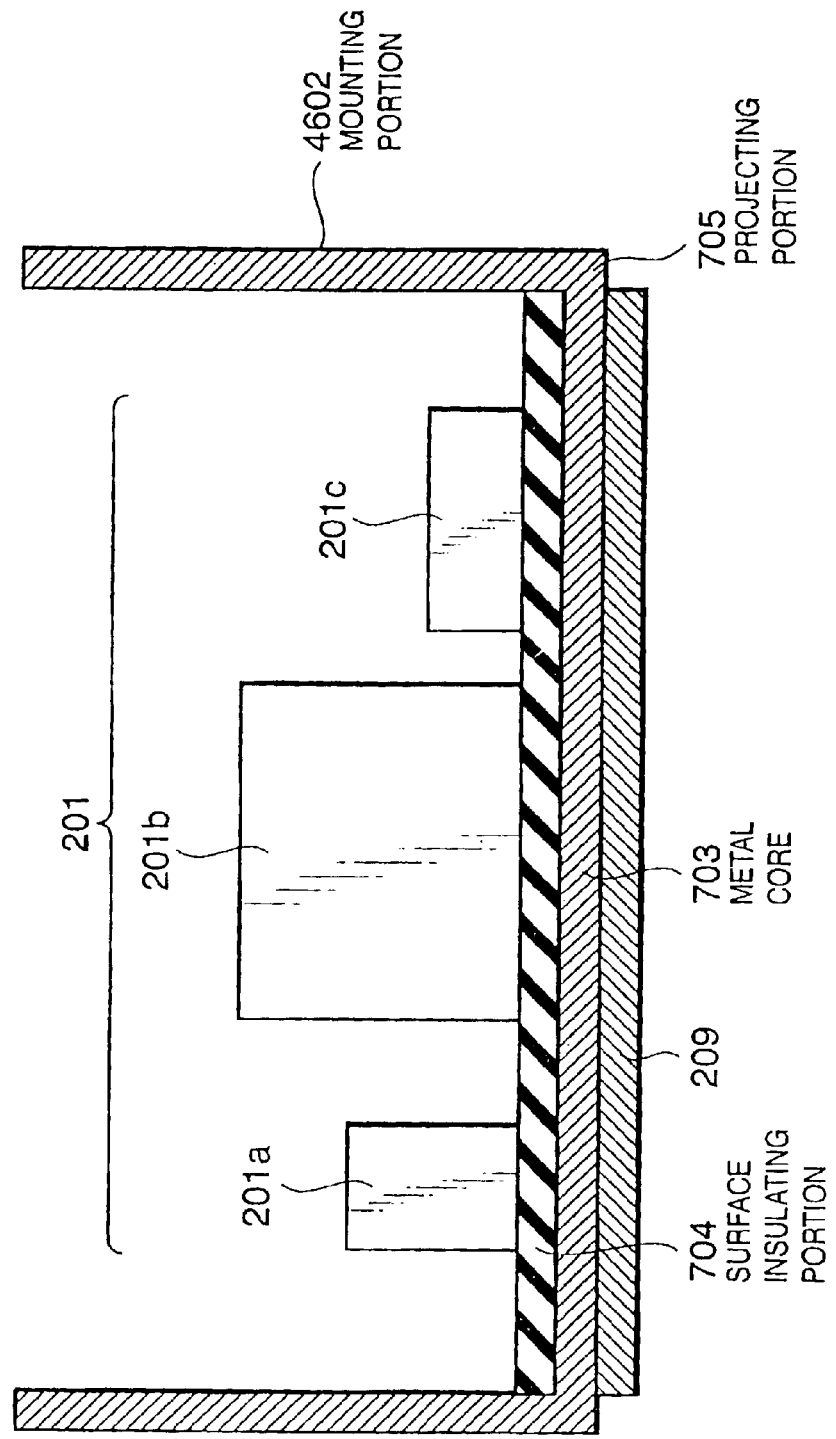
FIG. 7 is a sectional view showing the arrangement of a power conversion circuit of the fourth embodiment according to the present invention.

FIG. 7 is a detailed view of the power conversion circuit 4701.

This power conversion circuit 4701 is mounted on the printed circuit board 209, and the metal core 703 is present in layers of this printed circuit board 209. The metal core 703 projects to the outside from end portions of the surface insulating layer 704. These projecting portions 705 form the mounting members 4602 to be attached to the second member 206.

Figure 6:
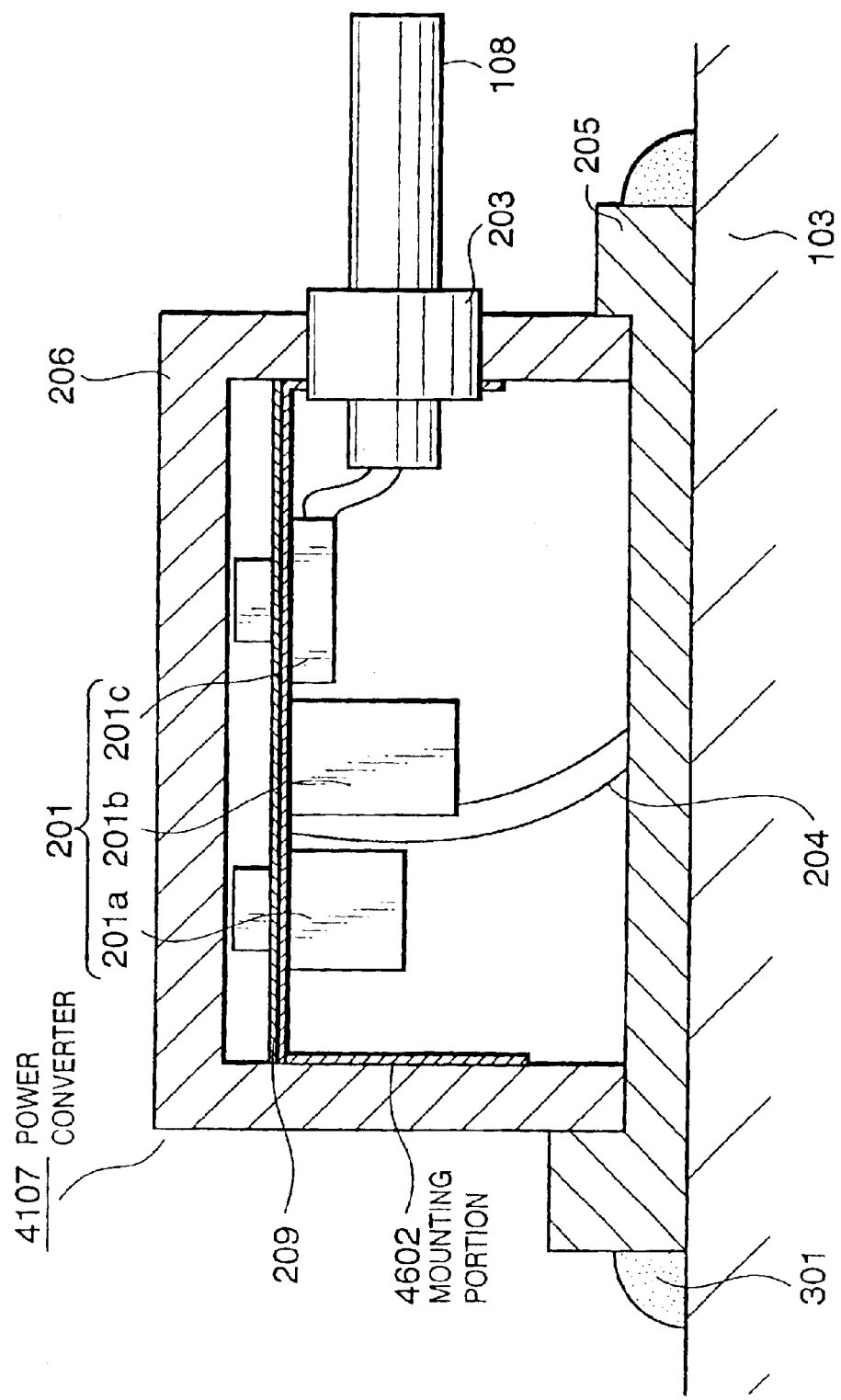
FIG. 6 is a sectional view showing the arrangement of a power converter of the fourth embodiment according to the present invention.

When a predetermined solar radiation amount is given to the solar cell module 4101 (not shown) in which the power converter 4107 shown in FIGS. 6 and 7 is integrated with the solar cell module main body 110, the power converter 4107 converts DC power generated by a photovoltaic element 106 into AC power, and this AC power can be output through output lead wires 108.

A first member 205 having small thermal conductivity prevents the conduction of heat from the solar cell module 4101 heated to a high temperature by solar radiation, to the power converter 4107 via a rear-surface reinforcing material 103.

Also, heat generated by the power conversion circuit 201 is effectively radiated from the second member 206 having large thermal conductivity via the substrate 209. This can improve the conversion efficiency and reliability of the power converter 4107.

[Fifth Embodiment]

A power generator 5112 having a solar cell array 5111 which includes a plurality of solar cell module main bodies 5110 of the fifth embodiment according to the present invention, and a power converter 5107, will be described below.

The solar cell array 5111 has an arrangement in which a plurality of solar cell module main bodies 110 of the solar cell module 101 explained in the first embodiment shown in FIG. 1 are connected. The power converter 5107 used in the power generator 5112 can be any of the power converters 107, 2107, 3107, and 4107 explained in the first to fourth embodiments. However, input lead wires are preferably extracted from the same surface as output lead wires, or from a surface opposite to the output lead wires.

In the following explanation, therefore, a description of common portions explained in the first to fourth embodiments will be omitted to avoid duplication, and only differences will be described.

First, the characteristic feature of the solar cell module 5110 of the fifth embodiment will be explained below.

Figure 8:
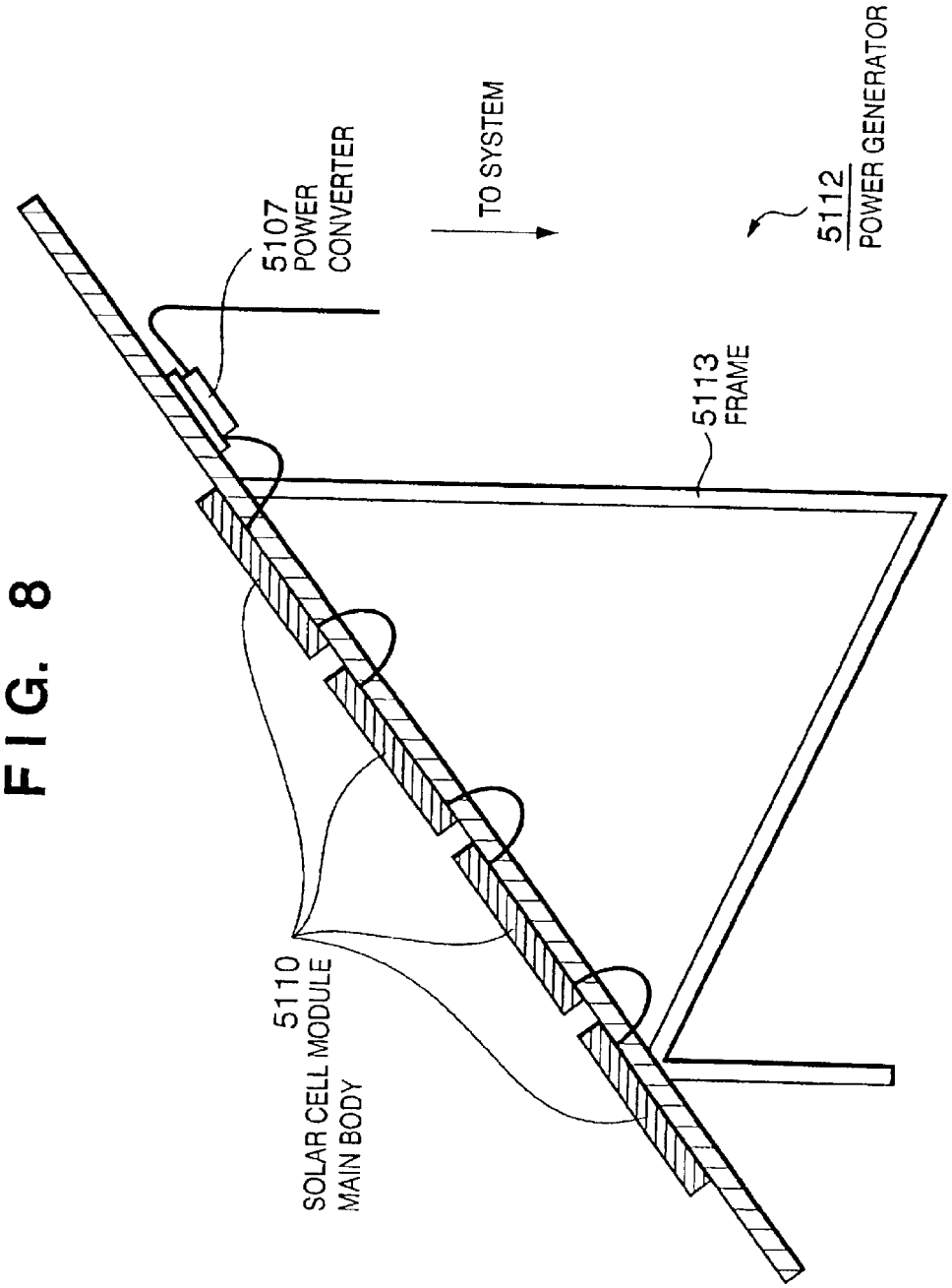
FIG. 8 is a sectional view showing the arrangement of a solar cell module of the fifth embodiment according to the present invention.

As shown in FIG. 8, in the power generator 5112, the solar cell array 5111 is formed by connecting a plurality of solar cell module main bodies 5110 on a frame 5113. Accordingly, the power generator 5112 of the fifth embodiment can extract a large amount of electric power.

DC power collected to the solar cell array 5111 is input to and converted by the power converter 5107. If necessary, the solar cell array can be connected to the utility line.

If the power converter 5107 is an inverter which converts DC power into AC power, the solar cell array 5111 is constructed by interconnecting a plurality of solar cell module main bodies 5110 by lead wires extracted from the solar cell module main bodies 5110. In this case, the solar cell array 5111 can also be constructed by connecting a plurality of solar cell module main bodies 5110 in series, and connecting the two ends of the series circuit to the power converter 5107.

The solar cell array 5111 can be similarly constructed even when the power converter 5107 is a DC/DC converter. In this case, the solar cell array 5111 can be connected to the utility line by collecting power from a plurality of main bodies 5110, converting the collected power into a desired DC voltage, and, where necessary, converting the DC power into AC power by a DC/AC converter such as a utility interactive inverter.

Note that the solar cell module main body 5110 has a terminal box (not shown) for extracting power, or has a power extracting cable having a waterproof connector at its end portion. The solar cell array 5111 is constructed by interconnecting a plurality of solar cell module main bodies 5110 by connecting the terminal boxes by lead wires or by connecting the waterproof connectors.

When a predetermined solar radiation amount is given to the power generator 5112 thus manufactured, the power converter 5107 converts DC power generated by the solar cell module main bodies 5110, and this AC power can be output to the utility line.

A first member 205 having small thermal conductivity prevents the conduction of heat from the frame 5113 to a power conversion circuit 201. Also, heat generated by the power conversion circuit 201 is effectively radiated from a second member 206 having large thermal conductivity. This can improve the conversion efficiency and reliability of the power converter 5107.

[Sixth Embodiment]

A solar cell module 6101 of the sixth embodiment according to the present invention will be described below.

A solar cell module main body of this solar cell module 6101 is exactly the same as the solar cell module main body 110 of the solar cell module 101 explained in the first embodiment, and only a power converter 6107 is different.

In the following explanation, therefore, that view showing the whole configuration of the solar cell module 6101, which corresponds to FIG. 1, and a common description thereof will be omitted to avoid duplication, and only differences from the power converter 107 will be explained by using the power converter 6107 shown in FIG. 9.

In this explanation of FIG. 9, the same reference numerals as in the power converter 107 shown in FIG. 2 denote the same parts and a detailed description thereof will be omitted to avoid duplication, and only differences will be explained.

[Power Converter]

First, the characteristic feature of the power converter 6107 of the sixth embodiment will be described below.

This power converter 6107 is characterized in that the thermal conductivity of a second member 6206 is higher than that in the power converter 107 of the first embodiment.

The arrangement of the power converter 6107 will be explained.

The components of this power converter 6107 are the same as the power converter 107 except for the second member. In the power converter 6107, a substrate 209 on which a power conversion circuit 201 is mounted is fixed to the second member 6206 superior in heat radiation properties.

More specifically, a modified PPO resin containing a copper powder is used as the second member. Note that the material of the second member 6206 need only be a resin mixed with a thermally conductive material. Examples of this thermally conductive material are fine metal powders, metal oxides, metal fibers, and metal-coated glass beads using Al, Cu, Ni, ZnO, $SnO_2$, Ag, and stainless steel, and synthetic fibers. Carbon black, carbon fibers, or graphite can also be used as the thermally conductive material. As the resin to be mixed with the thermally conductive material, the various resins used in the first member 205 described in the first embodiment can be used.

Conduction of heat can be further improved by interposing a high-thermal-conductivity filler between the substrate 209 and the second member 6206 as in the third embodiment.

Figure 9:
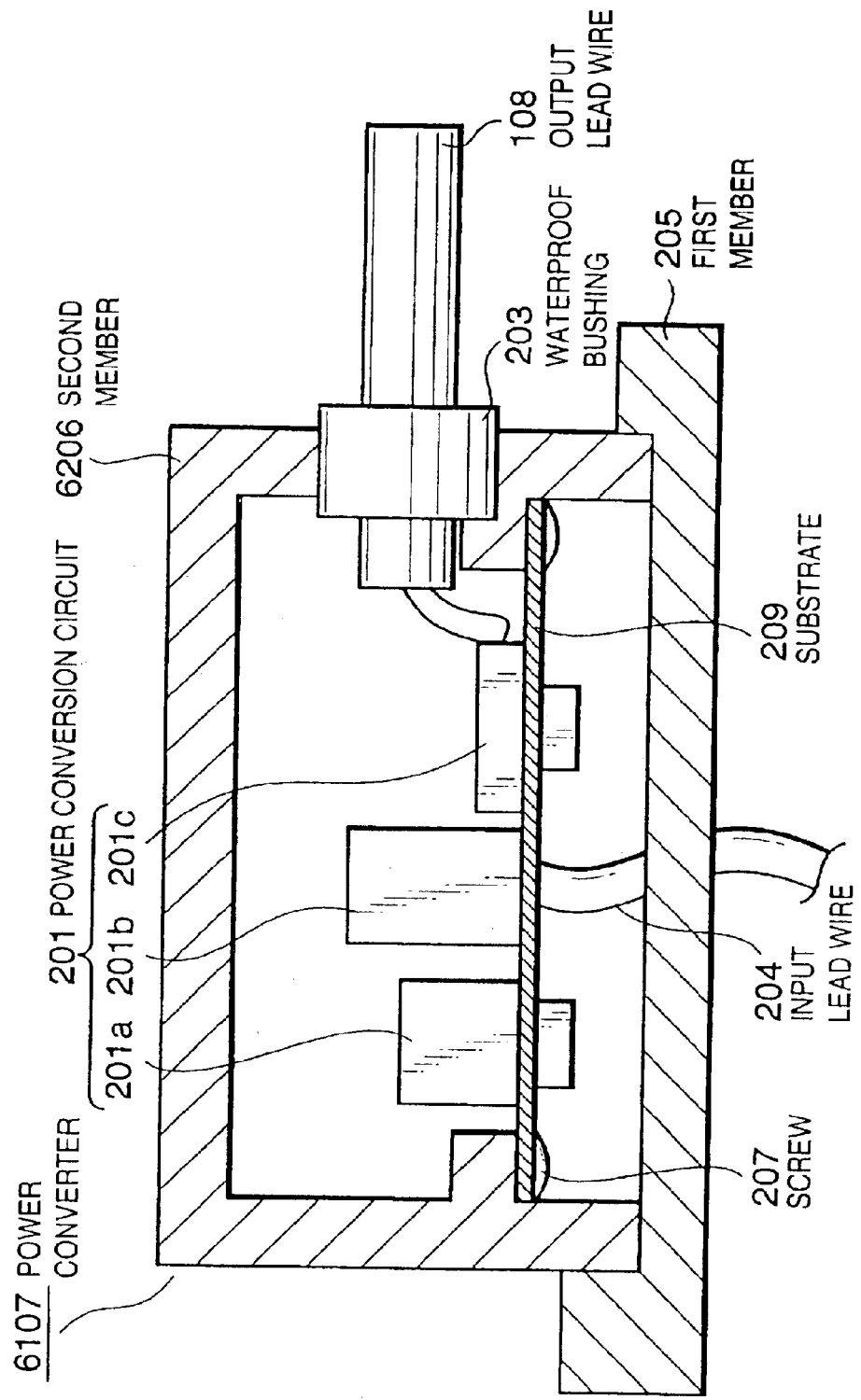
FIG. 9 is a sectional view showing the arrangement of a solar cell module of the sixth embodiment according to the present invention.

When a predetermined solar radiation amount is given to the solar cell module in which the power converter 6107 shown in FIG. 9 is integrated with the solar cell module main body, the power converter converts DC power generated by a photovoltaic element into AC power, and this AC power can be output through output lead wires. A first member 205 having small thermal conductivity prevents the conduction of heat from the solar cell module heated to a high temperature by solar radiation, to the power converter 6107 via a rear-surface reinforcing material.

Also, heat generated by a power conversion circuit 201 is effectively radiated from the second member 6206 having large thermal conductivity via the substrate 209. This can improve the conversion efficiency and reliability of the power converter 6107.

Furthermore, electromagnetic waves generated by the power converter 6107 can be shut off by the second member 6206 comprising a thermally conductive material. This effectively reduces influence on surrounding electric and electronic apparatuses.

The characteristic features and effects of the structures of the power converter, solar cell module (photovoltaic element module), and power generator explained in each embodiment will be summarized below.

That is, to realize downsizing of the solar cell module of each embodiment, the thickness is reduced by fixing the power converter to the solar cell module main body containing the solar cell. In addition, a material having small thermal conductivity is used as the protective case for protecting the power conversion circuit fixed to the solar cell module main body. This prevents easy conduction of heat from the solar cell module main body heated to a high temperature to the power conversion circuit. Furthermore, to allow easy radiation of heat generated by the power conversion circuit, a material having large thermal conductivity is used as the member of the protective case for fixing the power conversion circuit. As a consequence, the following effects are achieved.

(1) An intense heat generated by sunlight and conducted to the power conversion circuit contained in the protective case of the power converter via the rear-surface reinforcing material of the solar cell module main body is effectively shut off by the low-thermal-conductivity member of the protective case in contact with the rear-surface reinforcing material. Heat generated by the power converter is effectively radiated by the high-thermal-conductivity member in contact with the power converter. Consequently, a temperature rise of the power conversion circuit reduces, and this improves the conversion efficiency and reliability of the power converter.

(2) To connect the power converter to the solar cell module main body, no gap need be formed to prevent easy conduction of heat between the rear-surface reinforcing material of the solar cell module main body and the power converter, unlike in the conventional systems. This improves the mechanical strength of the whole solar cell module and downsizes the solar cell module.

As has been described above, the present invention can provide a solar cell module (photovoltaic element module) in which a solar cell module (photovoltaic element module) main body containing a solar cell (photovoltaic element) is integrated with a power converter for converting output electric power from the solar cell, and which is suited to downsizing and capable of improving the efficiency and reliability of the power converter.

As many apparently widely different embodiments of the present invention can be made without departing from the spirit and scope thereof, it is to be understood that the invention is not limited to the specific embodiments thereof except as defined in the appended claims.

What is claimed is:

1. A power converter comprising a power conversion circuit for converting an output from a photovoltaic element and outputting the converted output, and a protective case containing said power conversion circuit, wherein said protective case comprises:
- a first portion for fixing said protective case to a photovoltaic element module main body comprising said photovoltaic element; and
- a second portion for fixing said power conversion circuit, wherein a space, in which air can flow, does not exist between said protective case and said photovoltaic element module main body, and wherein the thermal conductivity of the material of said first portion is smaller than that of the material of said second portion.

2. The converter according to claim 1, wherein the material of said first portion is a plastic material containing one member selected from the group consisting of polycarbonate, polyamide, polyacetal, modified PPO (PPE), polyester, polyallylate, unsaturated polyester, a phenolic resin, an epoxy resin, polybutyleneterephthalate, nylon, polypropylene, polyvinyl chloride, and an ABS resin.

3. The converter according to claim 1, wherein the material of said second portion contains one member selected from the group consisting of an aluminum plate, stainless steel plate, zinc-plated steel plate, galvalume steel plate, titanium steel plate, and stainless steel plate.

4. A power converter comprising a power conversion circuit for converting an output from a photovoltaic element and outputting the converted output, and a protective case containing said power conversion circuit, wherein said protective case comprises:
- a first portion for fixing said protective case to a photovoltaic element module having said photovoltaic element; and
- a second portion for fixing said power conversion circuit, wherein the thermal conductivity of the material of said first portion is smaller than that of the material of said second portion, and wherein the material of said second portion is a resin mixed with a thermally conductive material.

5. The converter according to claim 4, wherein the thermally conductive material contains at least one of a metal powder, metal oxide, metal fibers, metal-coated glass beads, and synthetic fibers.

6. The converter according to claim 4, wherein the thermally conductive material contains at least one of Al, Cu, Ni, ZnO, $SnO_2$, Ag, and stainless steel.

7. The converter according to claim 4, wherein the thermally conductive material contains at least one of carbon black, carbon fibers, and graphite.

8. The converter according to claim 4, wherein the material of said first portion is a plastic material containing one member selected from the group consisting of polycarbonate, polyamide, polyacetal, modified PPO (PPE), polyester, polyallylate, unsaturated polyester, a phenolic resin, an epoxy resin, polybutyleneterephthalate, nylon, polypropylene polyvinyl chloride, and an ABS resin.

9. The converter according to claim 1, wherein said power conversion circuit is fixed in contact with a surface of said second portion.

10. The converter according to claim 1, wherein said power conversion circuit is fixed away from said second portion.

11. The converter according to claim 1, wherein said power conversion circuit is fixed to said second portion by using fixing means.

12. The converter according to claim 11, wherein said fixing means is mechanical fixation using a screw or fixation using an adhesive or filler.

13. The converter according to claim 1, wherein an adhesive or filler is packed between said protective case and said power conversion circuit.

14. The converter according to claim 1, wherein said power converter is an inverter which converts DC power into AC power.

15. The converter according to claim 1, wherein said power conversion circuit is mounted on a substrate having a metal core.

16. The converter according to claim 1, wherein said power converter is a DC/DC converter which converts DC power into another DC power having a different voltage.

17. The converter according to claim 1, wherein said photovoltaic element contains one member selected from the group consisting of a silicon semiconductor, compound semiconductor, single-crystal silicon, polysilicon, amorphous silicon, and thin-film polysilicon.

18. The converter according to claim 1, wherein said photovoltaic element is filled with a transparent insulating member and contained in said photovoltaic element module main body.

19. The converter according to claim 18, wherein said insulating member is transparent by the use of one member selected from the group consisting of an ethylene-vinyl acetate copolymer (EVA), ethylene-methyl acrylate copolymer (EMA), ethylene-ethyl acrylate copolymer (EEA), and polyvinyl butyral resin.

20. A photovoltaic element module comprising:
a photovoltaic element module main body comprising a photovoltaic element; and
a power converter comprising a power conversion circuit for converting an output from said photovoltaic element and outputting the converted output, and a protective case containing said power conversion circuit;
wherein said protective case comprises:
a first portion for fixing said protective case to said photovoltaic element module main body; and
a second portion for fixing said power conversion circuit,
wherein a space, in which air can flow, does not exist between said protective case and said photovoltaic element module main body, and
wherein the thermal conductivity of the material of said first portion is smaller than that of the material of said second portion.

21. A power generator using a photovoltaic element module comprising:
a photovoltaic element module main body comprising a photovoltaic element; and
a power converter comprising a power conversion circuit for converting an output from said photovoltaic element and outputting the converted output, and a protective case containing said power conversion circuit;
wherein said protective case comprises:
a first portion for fixing said protective case to said photovoltaic element module main body; and
a second portion for fixing said power conversion circuit,
wherein a space, in which air can flow does not exist between said protective case and said photovoltaic element module main body, and
wherein the thermal conductivity of the material of said first portion is smaller than that of the material of said second portion.

22. The generator according to claim 21, wherein said power generator comprises a plurality of photovoltaic element module main bodies, and said plurality of photovoltaic element module main bodies are connected to said power converter.

23. A power generator comprising:
a plurality of photovoltaic element module main bodies, each of which has a photovoltaic element;
a power converter which comprises a power conversion circuit to convert electric power output from the plurality of photovoltaic element module main bodies, and a protective case containing said power conversion circuit; and
a frame to which the plurality of photovoltaic element module main bodies and the power converter are fixed,
wherein said protective case is formed by a first portion which fixes the power converter to said frame, and a second portion to which said power conversion circuit is fixed, and
wherein the thermal conductivity of the material of said first portion is smaller than that of the material of said second portion.

24. A power converter comprising a power conversion circuit for converting an output from a photovoltaic element and outputting the converted output, and a protective case containing said power conversion circuit,
wherein said protective case comprises:
a first portion for fixing said protective case to a photovoltaic element module main body having said photovoltaic element; and
a second portion for fixing said power conversion circuit,
wherein the thermal conductivity of the material of said first portion is smaller than that of the material of said second portion, and
wherein said photovoltaic element module main body comprises a metal reinforcing plate which is arranged on a rear surface opposite to a light-receiving surface of said photovoltaic element and to which the protective case is installed.

* * * * *